(12) United States Patent
Xu et al.

(10) Patent No.: US 7,910,453 B2
(45) Date of Patent: Mar. 22, 2011

(54) STORAGE NITRIDE ENCAPSULATION FOR NON-PLANAR SONOS NAND FLASH CHARGE RETENTION

(75) Inventors: Jeff J. Xu, Jhubei (TW); Chia-Ta Hsieh, Tainan (TW); Chun-Pei Wu, Nantou County (TW); Chun-Hung Lee, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 12/172,687

(22) Filed: Jul. 14, 2008

(65) Prior Publication Data
US 2010/0006974 A1    Jan. 14, 2010

(51) Int. Cl.
*H01L 21/76* (2006.01)

(52) U.S. Cl. ........ 438/424; 438/196; 438/218; 438/221; 438/294; 438/404; 257/93; 257/374; 257/446; 257/501; 257/506

(58) Field of Classification Search ........ 438/196, 438/218, 221, 294, 296, 404, 412, FOR. 221, 438/424; 257/93, 374, 446, 501, 506, E21.54, 257/E21.545, E21.564
See application file for complete search history.

(56) References Cited

U.S. PATENT DOCUMENTS

| | | | |
|---|---|---|---|
| 6,599,824 B1 * | 7/2003 | Krivokapic | 438/618 |
| 2005/0139952 A1 | 6/2005 | Koh | |
| 2007/0287245 A1 * | 12/2007 | Hieda et al. | 438/211 |
| 2008/0087941 A1 * | 4/2008 | Yun et al. | 257/324 |
| 2008/0160695 A1 * | 7/2008 | Shin | 438/264 |

FOREIGN PATENT DOCUMENTS

CN    1697155    11/2005

OTHER PUBLICATIONS

Chinese Patent Office, Office Action of Apr. 13, 2010, Application No. 200910000109.4, 5 pages.

* cited by examiner

*Primary Examiner* — N Drew Richards
*Assistant Examiner* — Joannie A Garcia
(74) *Attorney, Agent, or Firm* — Haynes and Boone, LLP (57) ABSTRACT

The present disclosure provides a method of manufacturing a microelectronic device. The method includes forming recessed shallow trench isolation (STI) features in a semiconductor substrate, defining a semiconductor region between adjacent two of the recessed STI features; forming a tunnel dielectric feature within the semiconductor region; forming a nitride layer on the recessed STI features and the tunnel dielectric feature; etching the nitride layer to form nitride openings within the recessed STI features; partially removing the recessed STI features through the nitride openings, resulting in gaps between the nitride layer and the recessed STI features; and forming a first dielectric material on surfaces of the nitride layer, sealing the nitride openings.

18 Claims, 8 Drawing Sheets

STORAGE NITRIDE ENCAPSULATION FOR NON-PLANAR SONOS NAND FLASH CHARGE RETENTION

BACKGROUND

In integrated circuit (IC) devices, current non-planar NAND memory architecture uses recessed shallow trench isolation (STI) to form FinFET-like memory cells to overcome planar NAND scaling barrier beyond 45 nm technology node. However, the nitride storage layer for the FinFET-like cell contacts the STI oxide material, which raises a charge retention concern when the nitride storage layer is conducting. Accordingly, it would be desirable to provide an improved non-planar memory cell and method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

In non-volatile memory devices, NAND memory cells have various advantages including efficiency and reduced dimensions. Currently, a non-planar NAND memory architecture is utilized with a structure similar to FinFET transistors and with recessed shallow trench isolation (STI). However, the silicon nitride layer of the NAND memory cells for charge trap directly contacts the STI oxide material and raises a charge retention concern. The present disclosure provides a non-planar memory cells and a method of manufacturing thereof addressing the issues.

FIGS. 1-8 are sectional views illustrating one embodiment of a semiconductor memory device at various manufacturing stages. A non-planar semiconductor memory device 100 and the method making the same are collectively described below with reference to FIGS. 1-8.

Figure 1:
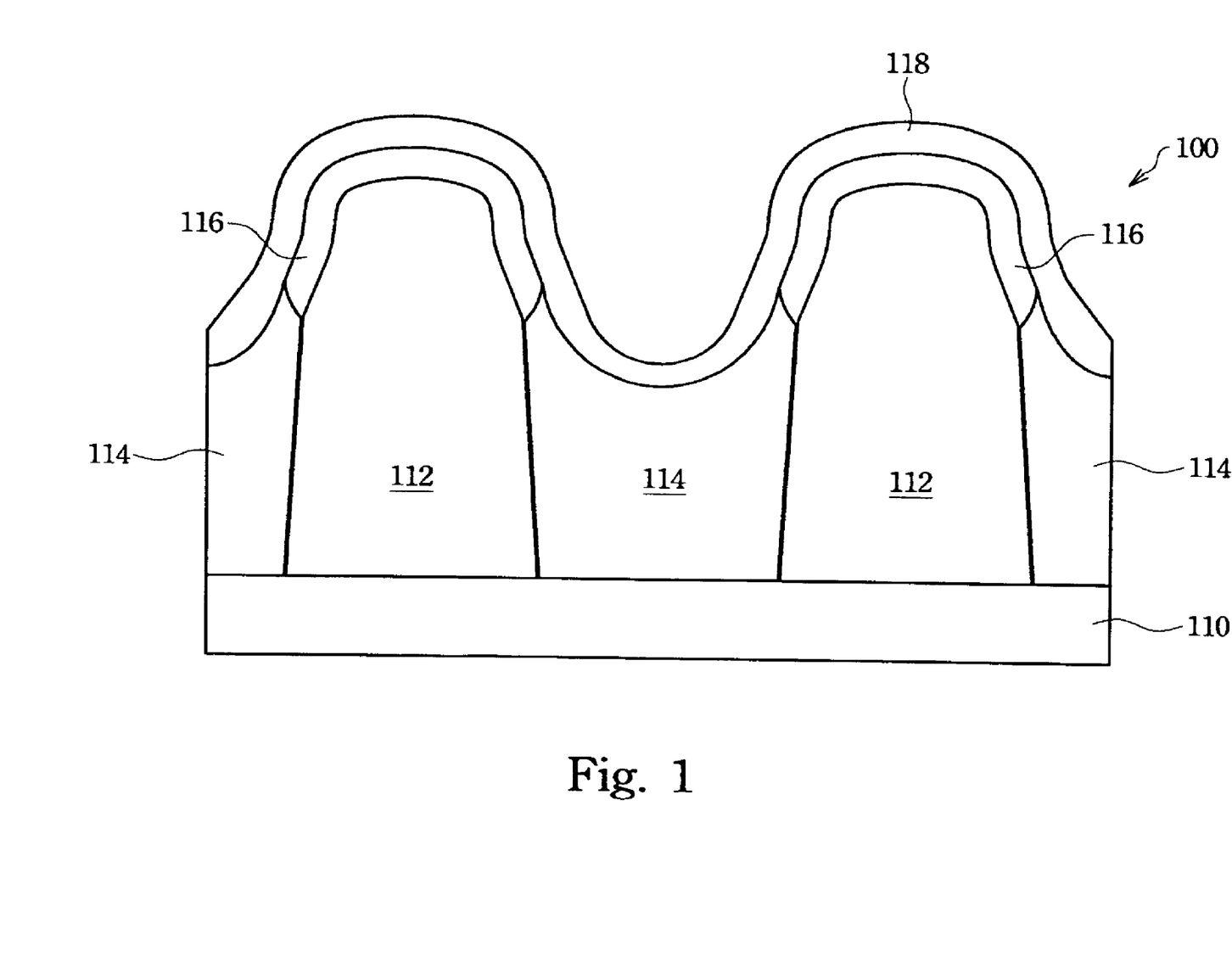
FIGS. 1-8 are sectional views illustrating an embodiment of a semiconductor memory device at various manufacturing stages constructed according to aspects of the present disclosure.

Referring to FIG. 1, the semiconductor device 100 includes a silicon substrate 110. In other embodiments, the substrate 110 may alternatively or additionally include other semiconductor material such as germanium, gallium arsenic and diamond.

The semiconductor device 100 also includes semiconductor ridges (or islands) 112 and isolation structures 114. Two adjacent semiconductor ridges are interposed by one of the isolation structures. The semiconductor ridges 112 include silicon. The semiconductor ridges also include various doped features designed for various functional features, such as source and drain regions, to be formed by doping methods, such as ion implantation, at proper fabrication steps. The isolation structures 114 are recessed from the top surface of the semiconductor ridges 112. The isolation structures include silicon oxide. Alternatively, the isolation structures include silicon oxide, silicon nitride, and silicon oxynitride in various combinations. In one embodiment, the semiconductor ridges 112 and the isolation structures 114 are formed by a process referred to as shallow trench isolation (STI) known in the art. In STI method, a semiconductor wafer is etched to form various trenches and semiconductor ridges using a dry etch and/or a wet etch process. Then the trenches are filled with a dielectric material such as silicon oxide using a process including chemical vapor deposition (CVD). For example, high density plasma CVD (HDPCVD) is implemented to fill the trenches with silicon oxide. In another example, a high aspect ratio process CVD (HARP, developed by Applied Materials) is implemented to fill in the trenches with silicon oxide using ozone-tetraethyl orthosilicate (ozone-TEOS) precursor. The isolation trenches are filled such that the isolation structures 114 are recessed from the top surface of the silicon ridges 112. In one example, the isolation trenches are filled and then removed using a selective etching to form the recessed trench isolation structures 114. In one embodiment, each semiconductor ridge is configured to form a plurality of NAND memory cells in a line, therefore being referred to as a NAND string. FIG. 1 shows only two exemplary NAND strings for illustration.

Still referring to FIG. 1, the semiconductor device 100 also includes tunnel oxide features 116 disposed on the semiconductor ridges 112. The tunnel oxide features 116 include a predefined thickness according to device design for proper tunneling effect. In various embodiments, the tunnel oxide features 116 are manufactured by thermal oxidation or radical oxidation, therefore self-aligned to the semiconductor ridges. Alternatively, the tunnel oxide features 116 are manufactured by depositing a silicon oxide layer and then patterning the silicon oxide layer using a lithography patterning method. In another example, the tunnel oxide features include multiple layers configured for optimized tunnel effect and device integrity.

The semiconductor device 100 further includes a nitride storage layer 118 disposed on the tunnel oxide features 116 and the recessed isolation structures 114. The nitride storage layer 118 includes silicon nitride. In furtherance of the embodiment, the nitride storage layer 118 includes a conductive silicon-rich nitride layer. One method of forming the nitride storage layer utilizes a CVD process with precursors including hexachlorodisilane (HCD, $Si_2Cl_6$), Dichlorosilane (DCS, $SiH_2Cl_2$), Bis(TertiaryButylAmino)Silane (BTBAS, $C_8H_{22}N_2Si$), and Disilane (DS, $Si_2H_6$). The partial pressures for the precursors or the corresponding flow rates can be tuned for the expected silicon/nitride ratio in the nitride storage layer.

Figure 2:
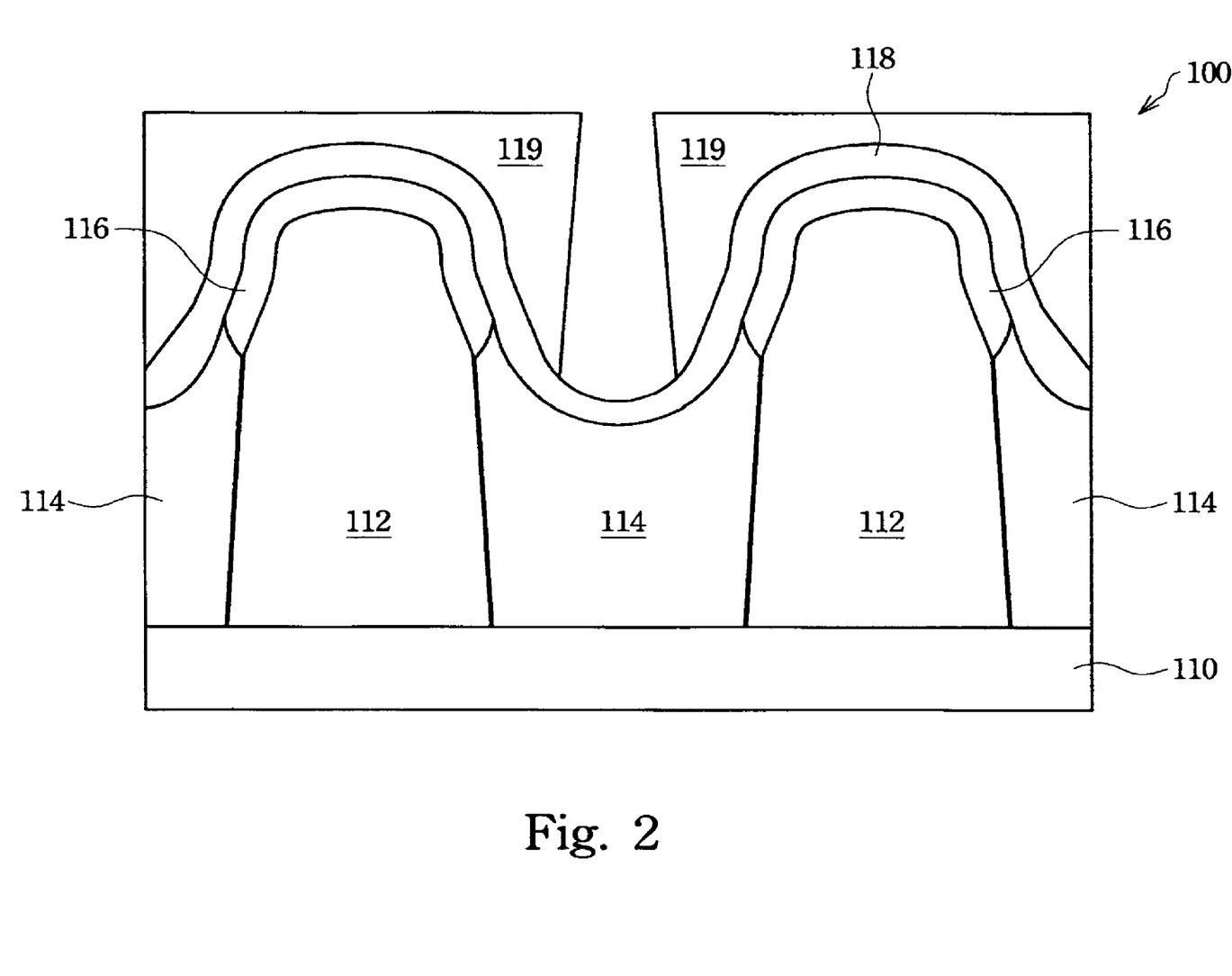
Figure 3:
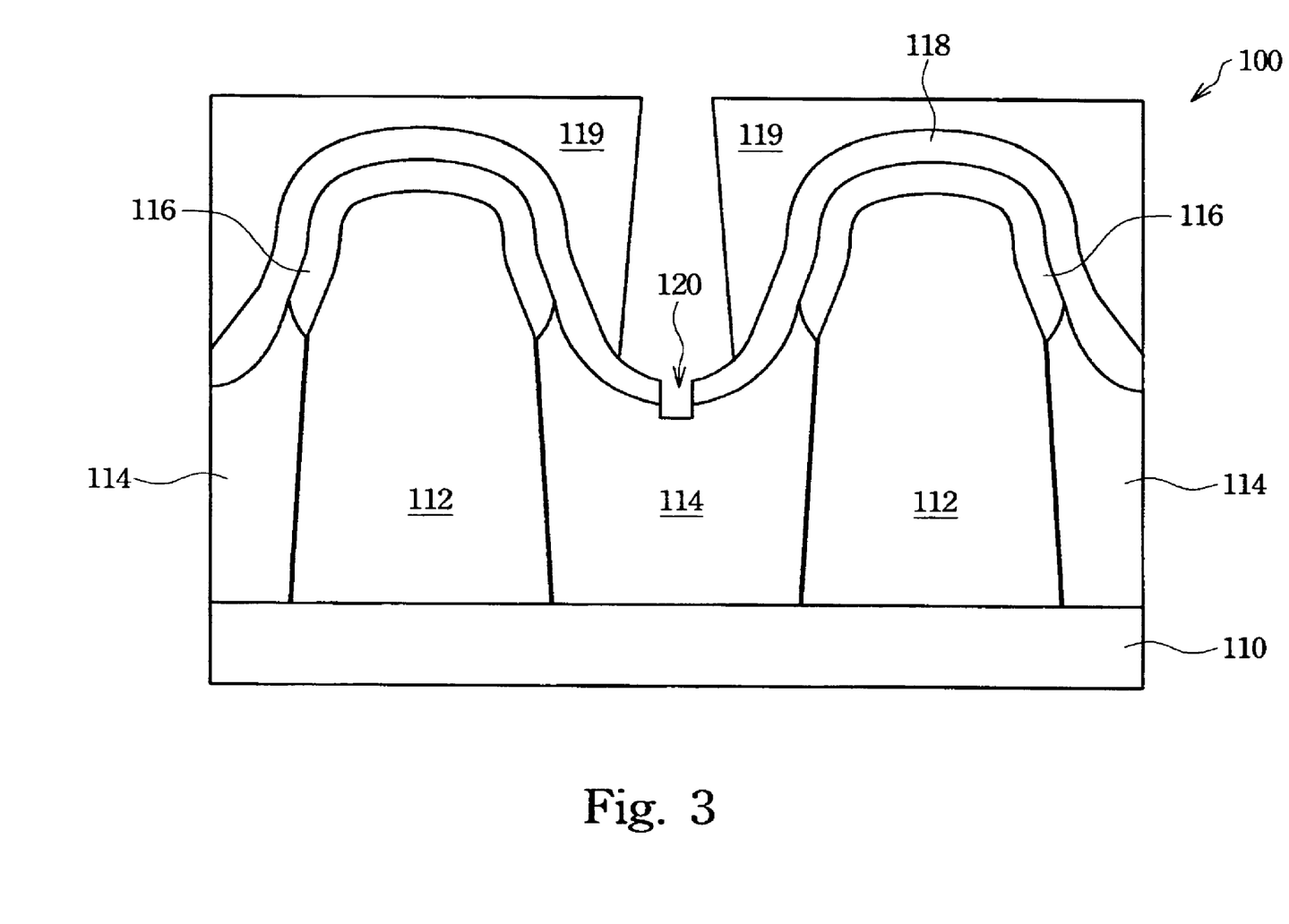
Figure 4:
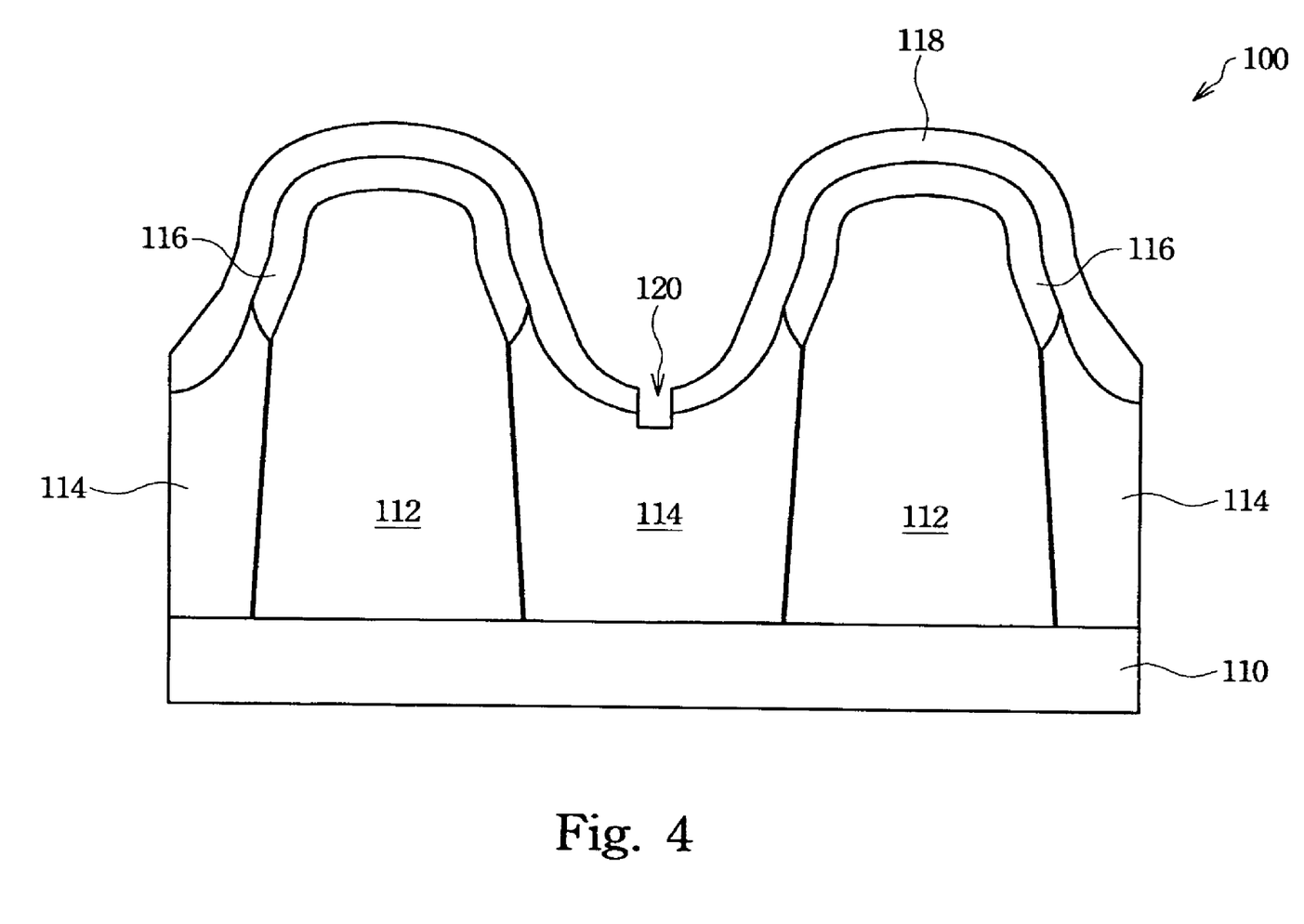

Referring to FIG. 4, the nitride storage layer 118 is etched to form openings 120 within the regions of the recessed isolation structures such that one NAND string is isolated from another one. In one embodiment, the etching process applied to the nitride storage layer 118 includes a self-aligned etching process described below with further reference to FIGS. 2 and 3. A non-conformal polymer layer 119 is deposited on the semiconductor device 100 to form a self-aligned mask for silicon nitride etching, as illustrated in FIG. 2. Then a plasma dry etching process is applied to the semiconductor device 100 to etch the nitride storage layer 118 between neighboring NAND strings using the self-aligned mask, as illustrated in FIG. 3. In one example, the silicon nitride etching process uses fluorine-containing plasma. Then, the self-aligned mask is removed by dry ashing and/or wet cleaning. The openings in the nitride storage layer 118 are formed, isolating the adjacent NAND strings from one another, as illustrated in FIG. 4. Alternatively, the openings 120 can be formed by forming a photoresist pattern using a lithography patterning process and then etching the silicon nitride layer using the photoresist pattern as an etching mask.

Figure 5:
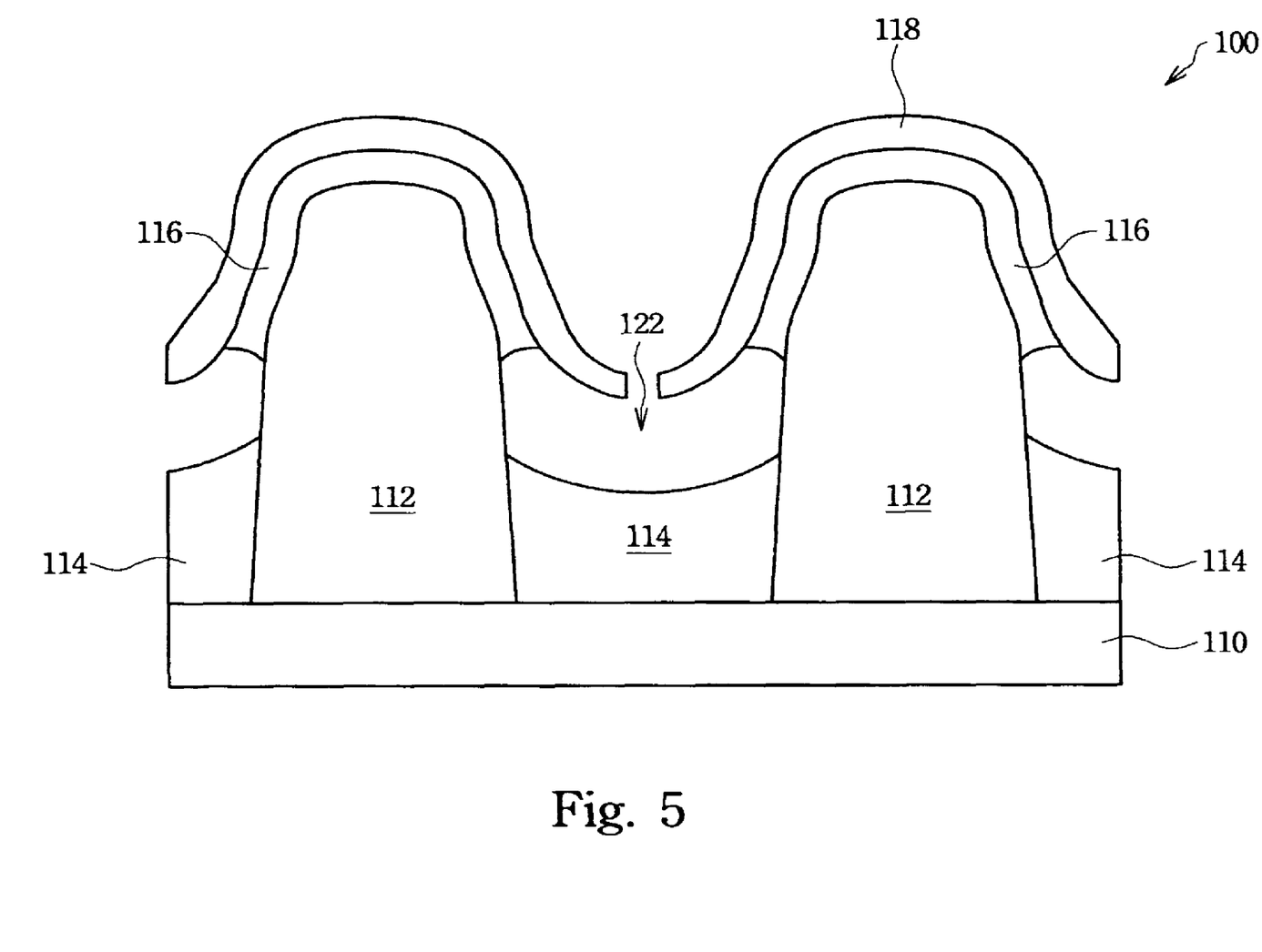

Referring to FIG. 5, an etching process, such as a wet etching process, is applied to the semiconductor device 100 to partially remove the isolation features 114 through the openings 120, resulting in gaps 122 formed horizontally between the semiconductor ridges 112. As an example, a buffered hydrofluoric acid (HF) is used to etch the isolation features of silicon dioxide to form the gaps 122.

Figure 6:
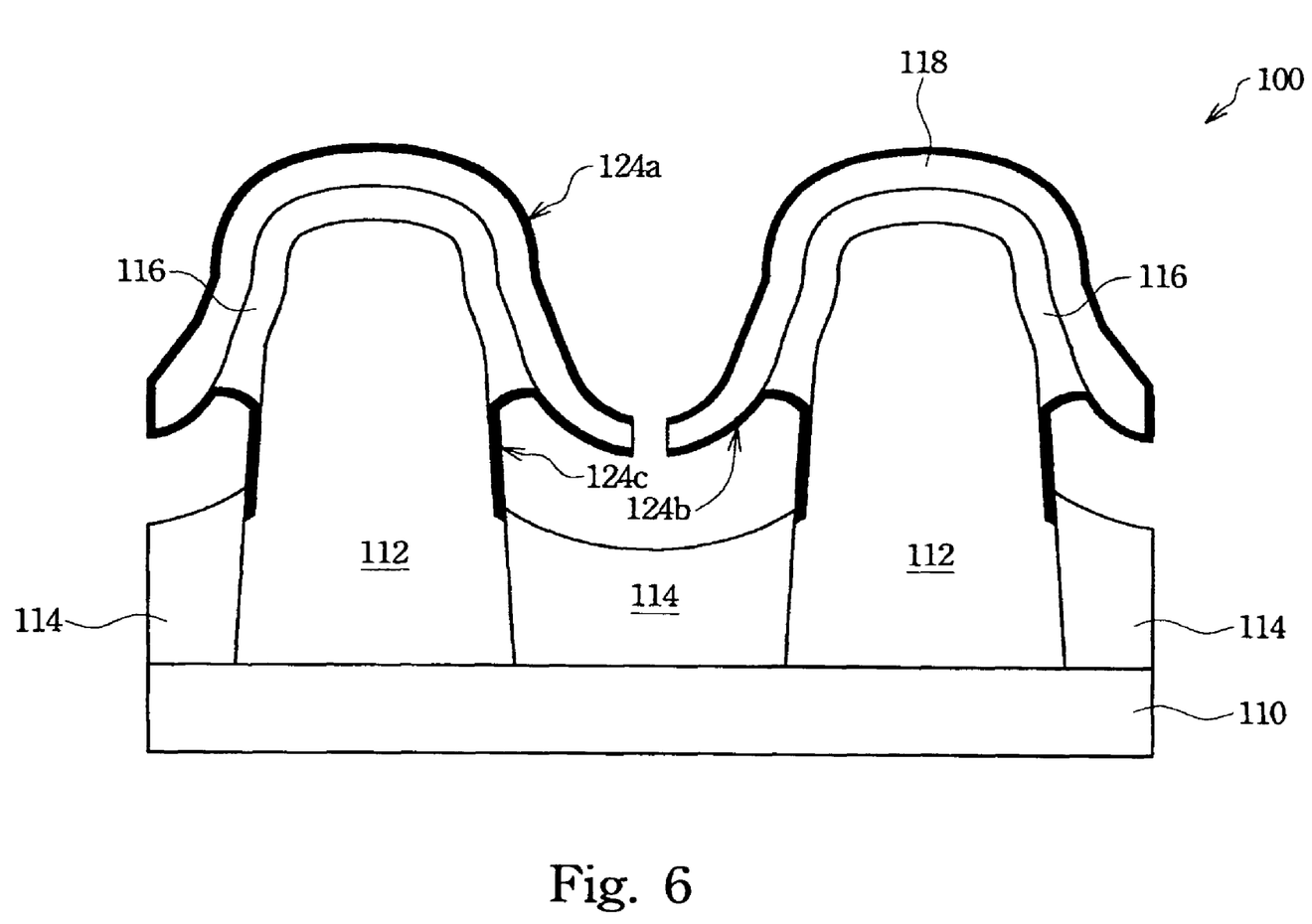

Referring to FIG. 6, a thin dielectric layer 124 may be formed on the surfaces of the nitride storage layer 118. Particularly, the thin dielectric layer 124a is formed on the upper surface of the nitride storage layer 118 and the thin dielectric layer 124b is formed on the lower surface of the nitride storage layer 118. Additionally, the thin dielectric layer 124c is also formed on the sidewalls of the semiconductor ridges 112 in the gaps. In one embodiment, the thin dielectric layer 124 includes silicon oxide. In furtherance of the embodiment, the thin silicon oxide dielectric layer is formed by a radical oxidation process such that a portion of the nitride storage layer is oxidized to form the silicon oxide layer.

Figure 7:
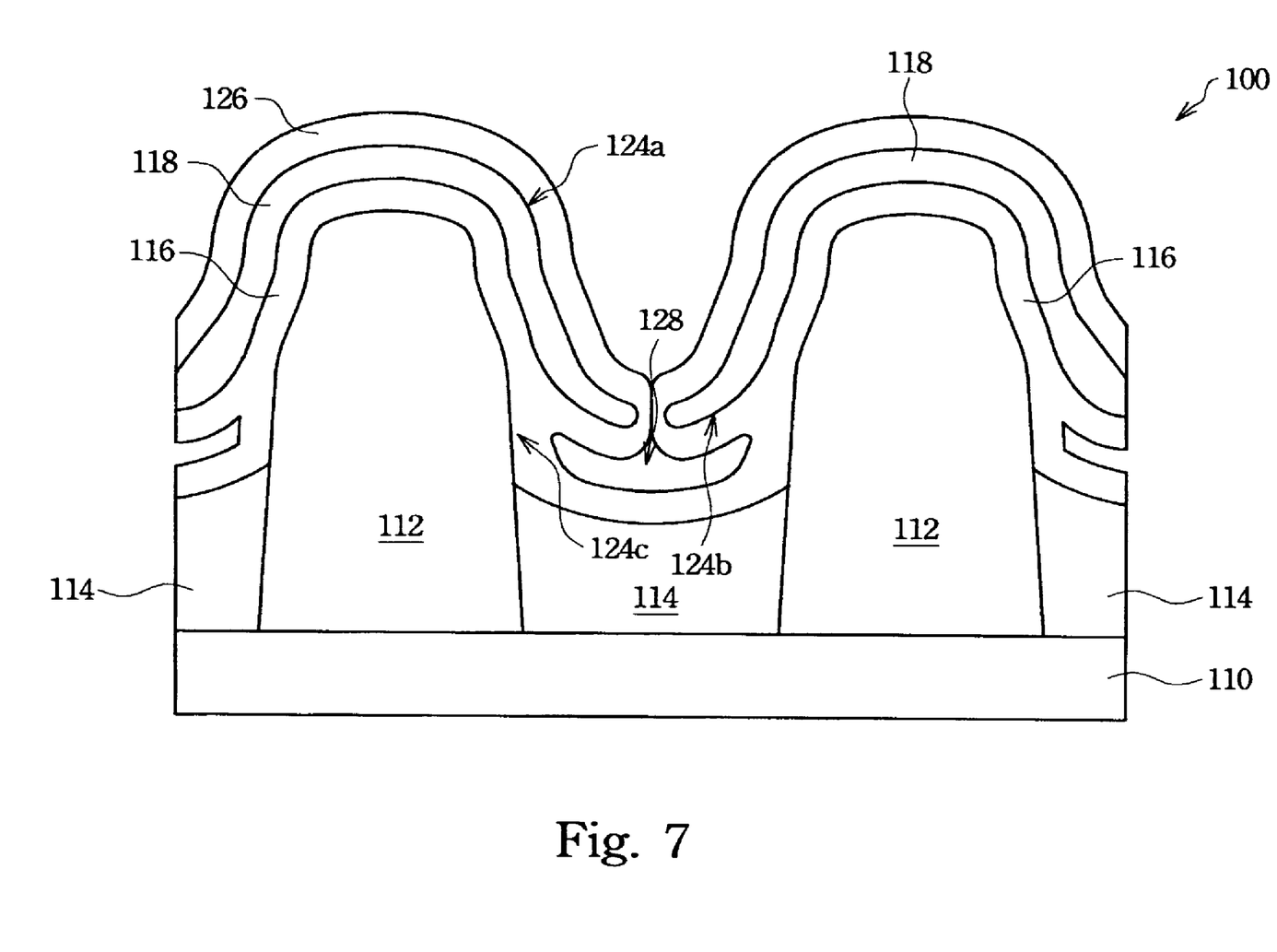

Referring to FIG. 7, a dielectric layer 126 is formed on the surfaces of the nitride storage layer 118. In one embodiment, the dielectric layer 126 is formed on the thin dielectric layer 124 such that the openings 120 are sealed, resulting in voids 128 horizontally between the silicon ridges 112 and vertically between the nitride storage layers 118 and the isolation features 114. In one example, the dielectric layer 126 is formed on the various portions of the thin dielectric layer 124, including the upper portions of the thin dielectric layer 124a, the lower portions of thin dielectric layer 124b, and the sidewall portions of the thin dielectric layer 124c. The dielectric layer 126 is formed through the openings 120 on the thin dielectric layer 124 in the openings and the voids. Additionally, the dielectric layer 126 is formed on the top surface of the isolation features 114 simultaneously. The dielectric layer 126 includes high temperature oxide (HTO) in one embodiment. In furtherance of the embodiment, the silicon oxide is formed by a CVD process, such as low pressure CVD (LPCVD), with a high deposition temperature. In one embodiment, the CVD temperature is greater than about 750° C. For example, the CVD temperature ranges from about 750° C. to about 1100° C.

In one embodiment, a radical oxidation process is applied to the semiconductor device 100 to convert a portion of the nitride storage layer 118 into silicon oxide as a portion of the top oxide of the oxide-nitride-oxide (ONO) structure in addition to the HTO oxide layer 126. The radical oxidation process can be implemented with processing parameters tuned for a predefined thickness of the top oxide of the ONO structure.

Figure 8:
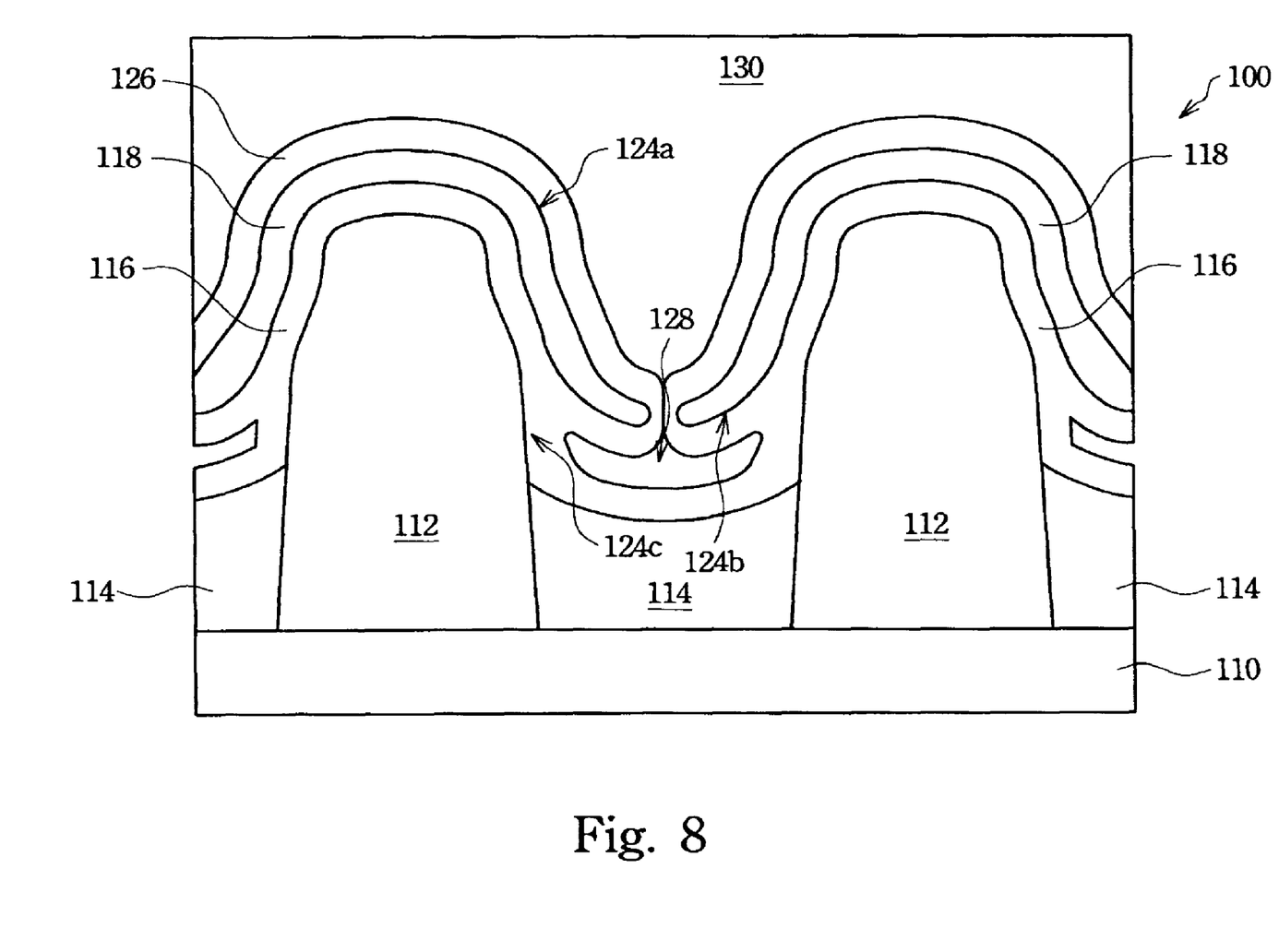

Referring to FIG. 8, a polysilicon layer 130 is deposited on the oxide layer 126 and is further patterned to form gate electrodes. In one embodiment, the gate electrodes may be formed by CVD and then doped after the deposition. The formation of the gate electrodes may include other processes such as ion implantation for polysilicon doping and/or annealing for silicidation. Alternatively, the polysilicon layer is in-situ doped during the CVD process. In another embodiment, spacers may be formed adjacent the polysilicon gate electrodes. The sealed voids may be completely or partially filled during spacer deposition.

Other processes can be implemented to form various device features, such as an ion implantation process applied to form source and drain features. In other examples, a silicidation process is applied to the source and drain features to form metal silicide with reduced contact resistance. The silicidation process can be applied to the polysilicon gate electrodes and the source/drain regions simultaneously.

Thus, the present disclosure provides an integrated memory circuit and a method of making the same. The formed memory device includes a NAND memory cell with a nitride storage feature completely encapsulated by high quality HTO dielectric material and/or radical oxidized oxide. The charge retention and the reliability issues relating to the direct contact between the trench isolation features and the nitride storage layer are reduced or eliminated. Other variations in this spirit and scope are considered as consistent with the present disclosure and are suggestive. For example, the present method is used to form NAND memory cells with reduced leakage issue. It may be implemented in other applications with similar configuration and related leakage issues. The present disclosure can be used to form silicon-oxide-nitride-oxide-silicon (SONOS) NAND memory cells. In another embodiment, the method can be used to form Si-Oxide-SiN—$Al_2O_3$—TaN (TANOS) NAND memory cells as well. For example, the top oxide layer formed on the nitride storage layer includes an aluminum oxide ($Al_2O_3$) high k dielectric material. In another example, the gate electrodes include metal or metal alloy, such as tantalum nitride (TaN), with high work functions and/or reduced electron tunneling during word line erasing. The gate electrodes may additionally or alternatively include other proper conductive materials such as tungsten and/or tungsten nitride.

In another embodiment, the substrate 110 may include a compound semiconductor, such as silicon carbide, gallium arsenic, indium arsenide, and indium phosphide. The substrate 110 may include an alloy semiconductor, such as silicon germanium, silicon germanium carbide, gallium arsenic phosphide, and gallium indium phosphide. Substrate 110 may also include a semiconductor on an insulator structure, such as a silicon-on-insulator (SOI) substrate. In another embodiment, substrate 110 includes a multiple silicon structure or a multilayer compound semiconductor structure. The semiconductor device may further include other functional devices and/or dummy features. For example, the semiconductor device includes a metal-oxide-semiconductor field-effect-transistor (MOSFET) or other type of transistors, such as Fin structure field effect transistors (FinFET), lateral diffused MOS (LDMOS), vertical diffused MOS (VDMOS), and/or strained MOS structures. In another embodiment, shallow trench isolation (STI) may be formed by dry-etching a trench in a substrate, lining the trench with a thermal oxide, and then filling the trench by insulator materials such as silicon oxide, silicon nitride, or silicon oxynitride. The filled trench may have a multi-layer structure, such as high density plasma CVD (HDPCVD) silicon oxide and undoped silica glass (USG).

The disclosed semiconductor device further includes various conductive features configured and coupled to form the integrated circuit. In one embodiment, the semiconductor device includes contacts and vias for vertical connection, and metal lines for horizontal wiring, collectively referred to as the multilayer interconnect. In one embodiment, the multilayer interconnect may include aluminum, aluminum/silicon/ copper alloy, titanium, titanium nitride, tungsten, polysilicon, metal silicide, or combinations as used in 0.18 mm or larger technology nodes. Aluminum interconnects may be deposited by sputtering, chemical vapor deposition (CVD), or combinations thereof. Other manufacturing processes, including photolithography and etching, may be used to pattern the conductive materials for vertical (via and contact) and horizontal connection (conductive line). Still other manufacturing processes such as thermal annealing may be used to form metal silicide. In another embodiment, the copper multilayer interconnect is utilized and includes copper, copper alloy, titanium, titanium nitride, tantalum, tantalum nitride, tungsten, polysilicon, metal silicide, or combinations as used for 0.18 mm or less technology nodes. The copper multilayer interconnect may be formed using a dual damascene process known in the art.

Thus, the present disclosure provides a method of manufacturing a microelectronic device. The method includes forming trenches and semiconductor ridges in a semiconductor substrate, each trench being interposed between two of the semiconductor ridges; filling the trenches with a first dielectric material to form recessed isolation features in the trenches; forming tunnel dielectric features on the semiconductor ridges, using a second dielectric material; forming a nitride layer on the recessed isolation features and the tunnel dielectric features; etching the nitride layer to form nitride openings each located in one of the trenches, exposing corresponding recessed isolation features in the trenches; partially removing the recessed isolation features through the nitride openings, resulting in gaps in the trenches and below the nitride layer; and forming a third dielectric material on surfaces of the nitride layer and sidewalls of the semiconductor ridges, sealing the nitride openings.

In one embodiment of the present disclosure, the method further includes forming a thin dielectric layer on the surfaces of the nitride layer and the sidewalls of the semiconductor ridges after the partially removing of the recessed isolation features and before the forming of the third dielectric material. The forming of the thin dielectric material may include forming a thin silicon oxide layer using radical oxidation. In another embodiment, the filling the trench with the first dielectric material includes using chemical vapor deposition (CVD). The filling the trench with the first dielectric material may include forming silicon oxide by high density plasma chemical vapor deposition (HDPCVD). The second dielectric material may include silicon oxide. The forming of the nitride layer may include forming a silicon-rich silicon nitride layer. The etching of the nitride layer may include applying a self-aligned etching process. In one embodiment, the self-aligned etching process includes forming a non-conformal polymeric material layer on the nitride layer as a self-aligned mask; applying plasma dry etch to cut through the nitride layer in the trenches; and removing the non-conformal polymeric material layer. The partially removing of the recessed isolation features may include applying a wet etching to the recessed isolation features through the nitride openings. The forming of the third dielectric material may include growing a high temperature oxide (HTO).

The present disclosure also provides another embodiment of a method making a microelectronic device. The method includes forming a silicon-rich nitride layer on a semiconductor substrate having silicon structures and dielectric regions, each of the silicon structures being interposed between two adjacent dielectric regions, and the dielectric regions including a first dielectric material; etching the silicon-rich nitride layer to form openings of the silicon-rich nitride layer within the dielectric regions; etching the first dielectric material in the dielectric regions through the openings to form gaps between the silicon structures; and forming a second dielectric material on the silicon-rich nitride layer and sidewalls of the silicon structures.

In one embodiment of the above method, the forming of the second dielectric material includes forming a thin silicon oxide layer using radical oxidation; and growing a high temperature oxide (HTO) layer on the thin silicon oxide layer. In another embodiment, the method further includes forming tunnel dielectric features on the silicon structures before the forming of the silicon-rich nitride layer.

The present disclosure also provides a semiconductor device. The semiconductor device includes a plurality of semiconductor features formed on a substrate; a plurality of isolation features formed on the substrate, wherein each of the semiconductor features is interposed between two adjacent isolation features, and the plurality of isolation features are recessed from a top surface of the semiconductor features; a silicon nitride layer disposed on the semiconductor features and the isolation features; and a silicon oxide layer interposed between the silicon nitride layer and the isolation features, separating adjacent semiconductor features from the silicon nitride layer.

In various embodiments of the disclosed semiconductor device, the silicon oxide layer may include a high temperature oxide (HTO) layer. The silicon oxide layer may further include a thin silicon oxide layer formed between the HTO layer and the silicon nitride layer, using radical oxidation. The silicon oxide layer may be disposed defining a void between the silicon oxide layer and one of the isolation features. The silicon nitride may include conductive silicon-rich nitride. The semiconductor device may further include a dielectric feature disposed on the silicon nitride layer, wherein the dielectric feature includes one of silicon oxide and aluminum oxide. The semiconductor device may further include a gate electrode disposed on the dielectric feature, wherein the gate electrode includes one of doped poly-silicon, titanium nitride, tungsten and tungsten nitride. In another embodiment, the semiconductor device includes a FINFET-like memory cell.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a microelectronic device, comprising:
    forming recessed shallow trench isolation (STI) features in a semiconductor substrate, defining a semiconductor region between adjacent two of the recessed STI features;
    forming a tunnel dielectric feature within the semiconductor region;
    forming a nitride layer on the recessed STI features and the tunnel dielectric feature;
    etching the nitride layer to form nitride openings within the recessed STI features;
    partially removing the recessed STI features through the nitride openings, resulting in gaps between the nitride layer and the recessed STI features; and forming a first dielectric material on surfaces of the nitride layer, sealing the nitride openings.

2. The method of claim 1, further comprising:
forming a thin dielectric layer on the surfaces of the nitride layer and sidewalls of the semiconductor substrate after partially removing the recessed STI features and before forming the first dielectric material.

3. The method of claim 2, wherein forming the thin dielectric material comprises forming a thin silicon oxide layer using radical oxidation.

4. The method of claim 1, wherein forming the recessed STI features comprises:
forming trenches in the semiconductor substrate; and
filling the trenches with a second dielectric material by chemical vapor deposition (CVD).

5. The method of claim 4, wherein filling the trenches with the second dielectric material comprises forming silicon oxide by high density plasma chemical vapor deposition (HDPCVD).

6. The method of claim 1, wherein the tunnel dielectric feature comprises silicon oxide.

7. The method of claim 1, wherein forming the nitride layer comprises forming a silicon-rich silicon nitride layer.

8. The method of claim 1, wherein etching the nitride layer comprises:
forming a non-conformal polymeric material layer on the nitride layer as a self-aligned mask;
applying plasma dry etch to cut through the nitride layer on the recessed STI features; and
removing the non-conformal polymeric material layer.

9. The method of claim 1, wherein partially removing the recessed isolation features comprises applying a wet etching to the recessed STI features through the nitride openings.

10. The method of claim 1, wherein forming the first dielectric material comprises growing a high temperature oxide (HTO).

11. A method of manufacturing a microelectronic device, comprising:
providing a silicon substrate having a recessed trench isolation feature in a dielectric region and a silicon feature in a silicon region adjacent the dielectric region;
forming a tunnel dielectric feature on the silicon substrate within the silicon region;
forming a silicon-rich nitride layer on a silicon substrate;
etching the silicon-rich nitride layer to form an opening within the dielectric region;
etching the recessed trench isolation feature through the opening to form a gap between the silicon-rich nitride layer and the recessed trench isolation feature; and
forming a first dielectric material on the silicon-rich nitride layer and sidewalls of the silicon feature.

12. The method of claim 11, wherein the forming of the first dielectric material comprises:
forming a thin silicon oxide layer using radical oxidation; and
growing a high temperature oxide (HTO) layer on the thin silicon oxide layer.

13. The method of claim 11, wherein the forming of the tunnel dielectric feature comprises forming a silicon oxide layer on the silicon feature.

14. A semiconductor device comprising:
a recessed shallow trench isolation (STI) feature formed in a semiconductor substrate, defining a STI region and a semiconductor region;
a tunnel oxide feature disposed on the semiconductor substrate within the semiconductor region;
a silicon nitride layer disposed on the semiconductor substrate, overlying the tunnel oxide feature and the recessed STI feature; and
a silicon oxide layer within the STI region and interposed between the recessed STI feature and the silicon nitride layer, separating the silicon nitride layer from sidewall of the semiconductor substrate.

15. The semiconductor device of claim 14, wherein the silicon oxide layer is disposed defining a void between the silicon oxide layer and one of the isolation features.

16. The semiconductor device of claim 14, wherein the silicon nitride comprises conductive silicon-rich nitride.

17. The semiconductor device of claim 14, further comprising a dielectric feature disposed on the silicon nitride layer, wherein the dielectric feature includes one of silicon oxide and aluminum oxide.

18. The semiconductor device of claim 14, wherein the semiconductor device comprises a FINFET-like memory cell.

* * * * *